(12) United States Patent
Wang et al.

(10) Patent No.: US 11,016,241 B2
(45) Date of Patent: May 25, 2021

(54) DISPLAY DEVICE AND DISPLAY METHOD

(71) Applicant: BOE TECHNOLOGY GROUP CO., LTD., Beijing (CN)

(72) Inventors: Wei Wang, Beijing (CN); Xiaochuan Chen, Beijing (CN); Xiandong Meng, Beijing (CN); Jifeng Tan, Beijing (CN); Pengxia Liang, Beijing (CN); Xianqin Meng, Beijing (CN); Jian Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/633,343

(22) PCT Filed: Nov. 15, 2018

(86) PCT No.: PCT/CN2018/115573
§ 371 (c)(1),
(2) Date: Jan. 23, 2020

(87) PCT Pub. No.: WO2019/179136
PCT Pub. Date: Sep. 26, 2019

(65) Prior Publication Data
US 2020/0158944 A1    May 21, 2020

(30) Foreign Application Priority Data
Mar. 23, 2018 (CN) .......................... 201810246269.6

(51) Int. Cl.
*G02B 6/00* (2006.01)
*G02B 6/34* (2006.01)
(Continued)

(52) U.S. Cl.
CPC ............ *G02B 6/0078* (2013.01); *G02B 6/002* (2013.01); *G02B 6/0073* (2013.01); *G02B 6/34* (2013.01);
(Continued)

(58) Field of Classification Search
CPC .. G02B 27/0172; G02B 6/002; G02B 6/0073; G02B 6/0078; G02B 6/34; G02B 30/27
See application file for complete search history.

(56) References Cited

U.S. PATENT DOCUMENTS

2014/0293389 A1   10/2014   Akutsu et al.
2016/0085300 A1    3/2016   Robbins et al.
(Continued)

FOREIGN PATENT DOCUMENTS

CN    106371222 A    2/2017
CN    106716223 A    5/2017
(Continued)

OTHER PUBLICATIONS

First Office Action for Chinese Application No. 201810246269.6, dated Mar. 3, 2020, 7 Pages.
(Continued)

*Primary Examiner* — Xuemei Zheng
(74) *Attorney, Agent, or Firm* — Brooks Kushman P.C.

(57) ABSTRACT

A display device includes: an optical waveguide layer having a light-entering region and a light-exiting region; an optical element correspondingly arranged in the light-entering region and configured to emit at least two types of light beams having different image information, to transmit the at least two types of light beams to the light-entering region of the optical waveguide layer; at least two coupling gratings arranged on transmission paths of the at least two types of light beams in the optical waveguide layer, and configured to change a direction of each of the at least two types of light
(Continued)

beams in the optical waveguide layer, to enable light beams in the at least two types of light beams in the optical waveguide layer to be transmitted to the light-exiting region, exit from the light-exiting region and be converged at at least one view point.

20 Claims, 8 Drawing Sheets

(51) Int. Cl.
 *G02B 27/01* (2006.01)
 *F21V 8/00* (2006.01)
 *G02B 30/20* (2020.01)
 *H01L 33/58* (2010.01)
 *H01L 51/52* (2006.01)

(52) U.S. Cl.
 CPC ......... *G02B 27/0172* (2013.01); *G02B 30/20* (2020.01); *H01L 33/58* (2013.01); *H01L 51/5275* (2013.01)

(56) References Cited

U.S. PATENT DOCUMENTS

| | | |
|---|---|---|
| 2016/0231566 A1 | 8/2016 | Levola et al. |
| 2017/0322418 A1* | 11/2017 | Lin ................... G02B 1/002 |
| 2018/0052276 A1* | 2/2018 | Klienman ............ G02B 6/0076 |
| 2018/0081176 A1 | 3/2018 | Olkkonen et al. |
| 2018/0267309 A1 | 9/2018 | Klug et al. |

FOREIGN PATENT DOCUMENTS

| | | |
|---|---|---|
| CN | 106773046 A | 5/2017 |
| CN | 206301118 U | 7/2017 |
| CN | 107250880 A | 10/2017 |
| CN | 107533166 A | 1/2018 |
| CN | 107615136 A | 1/2018 |
| CN | 107632406 A | 1/2018 |
| CN | 107797287 A | 3/2018 |
| WO | 2016046514 A1 | 3/2016 |

OTHER PUBLICATIONS

International Search Report and Written Opinion for Application No. PCT/CN2018/115573, dated Feb. 13, 2019, 10 Pages.

* cited by examiner

DISPLAY DEVICE AND DISPLAY METHOD

CROSS-REFERENCE TO RELATED APPLICATIONS

This application is the U.S. national phase of PCT Application No. PCT/CN2018/115573 filed on Nov. 15, 2018, which claims priority to Chinese Patent Application No. 201810246269.6 filed on Mar. 23, 2018, which are incorporated herein by reference in their entireties.

TECHNICAL FIELD

The present disclosure relates to the field of display technology, in particular to a display device and a display method.

BACKGROUND

In real world, when an object is viewed by human eyes at a distance from the object, a focus position of a single eye is consistent with a convergence distance of lines of sight for two eyes, i.e., on the object. However, in a current parallax three-dimensional (3D) technology, merely information about binocular parallax images viewed within an optical field, rather than optical field information such as a corresponding light direction desired for single-eye focusing, is provided by a screen, so the focus position of the single eye is always on the screen but the lines of sight for the two eyes are converged on a displayed virtual object at a certain distance from the screen due to the parallax. In other words, the focus position of the single eye is different from the convergence distance of the lines of sight for the two eyes, resulting in dizziness and discomfort of the viewer.

SUMMARY

In one aspect, the present disclosure provides in some embodiments a display device, including: an optical waveguide layer having a light-entering region and a light-exiting region; an optical element configured to emit at least two types of light beams having different image information, the optical element being arranged at the light-entering region, to transmit the at least two types of light beams to the light-entering region of the optical waveguide layer; a first coupling grating arranged on a transmission path of the at least two types of light beams in the optical waveguide layer, and configured to change a direction of each of the at least two types of light beams having entered the optical waveguide layer, to enable each of the at least two types of light beams in the optical waveguide layer to transmit in a direction toward the light-exiting region; and a second coupling grating arranged in the optical waveguide layer at a position corresponding to the light-exiting region, and configured to enable light beams formed by light beams having same image information in the at least two types of light beams to exit from the light-exiting region and be converged at a same viewpoint, and enable light beams formed by light beams having different image information in the at least two types of light beams to exit from the light-exiting region and be converged at different viewpoints, to form at least two predetermined viewpoints located within a visual range of a same pupil.

In some embodiments of the present disclosure, the first coupling grating is further configured to change the direction of the at least two types of light beams having entered the optical waveguide layer, to transmit the at least two types of light beams in the optical waveguide in the direction toward the light-exiting region in a total-reflection manner. The second coupling grating is further configured to enable totally-reflected light beams formed by light beams having the same image information in the at least two types of light beams to exit from the light-exiting region and be converged at the same viewpoint, and enable totally-reflected light beams formed by light beams having different image information in the at least two types of light beams to exit from the light-exiting region and be converged at different viewpoint.

In some embodiments of the present disclosure, the first coupling grating includes at least two first regions corresponding respectively to the at least two types of light beams, and a quantity of the at least two first regions is same as a quantity of the at least two types of light beams; and each first region includes one or more first grating bars, and the one or more first grating bars are arranged substantially parallel to each other on the optical waveguide layer and spaced apart from each other.

In some embodiments of the present disclosure, the second coupling grating includes at least two second regions, the at least two second regions correspond respectively to at least two types of light beams formed after the at least two types of light beams have been coupled by the first coupling grating; and each of the at least two second regions includes a plurality of ring-shaped gratings, the plurality of ring-shaped gratings are arranged on the optical waveguide layer and spaced apart from each other, and sleeved one on another, and each ring-shaped grating includes one or more second grating bars, the one or more second grating bars are arranged in a substantially circumferential direction along the ring-shaped grating and spaced apart from each other.

In some embodiments of the present disclosure, the first coupling grating is a reflection-type coupling grating or a transmission-type coupling grating, and the second coupling grating is a reflection-type coupling grating or a transmission-type coupling grating.

In some embodiments of the present disclosure, the display device further includes a third coupling grating arranged between the first coupling grating and the second coupling grating, and the third coupling grating is configured to enlarge a field angle range of the light beam transmitted in the optical waveguide layer.

In some embodiments of the present disclosure, the first coupling grating includes one or more first grating bars, the one or more first grating bars are arranged substantially parallel to each other on the optical waveguide layer and spaced apart from each other, the third grating coupling includes one or more third grating bars, the one or more third grating bars are arranged substantially parallel to each other on the optical waveguide layer and spaced apart from each other, and there is a predetermined angle between a direction in which the one or more first grating bars of the first coupling grating are arranged and a direction in which the one or more third grating bars of the third coupling grating are arranged.

In some embodiments of the present disclosure, the at least two types of light beams have different primary colors, and the optical waveguide layer includes at least two optical waveguide sub-layers laminated one on another. Each optical waveguide sub-layer has a light-entering sub-region and a light-exiting sub-region, the first coupling grating is arranged in each optical waveguide sub-layer at a position corresponding to the light-entering sub-region, and the second coupling grating is arranged in each optical waveguide sub-layer at a position corresponding to the light-exiting sub-region. The first coupling grating corresponding to a first optical waveguide sub-layer of the at least two optical waveguide sub-layers is configured to change a direction of a light beam having a first primary color, to transmit the light beam in the first optical waveguide sub-layer toward the light-exiting sub-region. The first coupling grating corresponding to a second optical waveguide sub-layer of the at least two optical waveguide sub-layers is configured to change a direction of a light beam having a second primary color, to transmit the light beam in the second optical waveguide sub-layer toward the light-exiting sub-region.

In some embodiments of the present disclosure, the optical element is further configured to emit at least three types of light beams having different primary colors, and the first coupling grating is arranged on each of the at least two optical waveguide sub-layers; the first coupling grating on a third optical waveguide sub-layer of the at least two optical waveguide sub-layers is provided with at least two third regions corresponding to the at least two types of light beams having different primary colors; and the first coupling grating corresponding to a fourth optical waveguide sub-layer of the at least two optical waveguide sub-layers is provided with at least one fourth region, and a primary color of the light beam corresponding to the fourth region is different from a primary color of the light beam corresponding to the third region.

In some embodiments of the present disclosure, the optical waveguide layer is a light guide plate having a first side and a second side arranged opposite to each other, and the light-entering region and the light-exiting region are arranged at different positions at a same side of the light guide plate.

In some embodiments of the present disclosure, the optical waveguide layer is a light guide plate having a first side and a second side arranged opposite to each other, the light-entering region is arranged at the first side, the light-exiting region is arranged at the second side, and an orthogonal projection of the light-entering region onto the second side is located at a position different from the light-exiting region.

In some embodiments of the present disclosure, the optical element includes at least two display elements arranged at the light-entering region of the light guide plate and configured to emit light beams having different image information.

In some embodiments of the present disclosure, the optical element includes one display element arranged at the light-entering region of the light guide plate and provided with at least two display sub-regions for emitting light beams having different image information.

In some embodiments of the present disclosure, the display element is a micro display device including a light source assembly and a display chip, and the light source assembly includes at least three types of monochromatic laser chips configured to emit different monochromatic light beams.

In some embodiments of the present disclosure, the display element is a micro display device including a light source assembly and a display chip, and the light source assembly includes at least three types of monochromatic Light-Emitting Diode (LED) chips and a collimation mechanism, the at least three types of monochromatic LED chips are configured to emit different monochromatic light beams, and the collimation mechanism is configured to collimate the monochromatic light beams emitted by the at least three types of monochromatic LED chips.

In some embodiments of the present disclosure, the display chip includes a digital optical processing chip and a timing control chip, and the timing control chip is configured to sequentially input the at least three types of monochromatic light beams emitted by the light source assembly into the digital optical processing chip.

In some embodiments of the present disclosure, the display element is an optical engine.

In some embodiments of the present disclosure, the display element includes a micro Organic Light-Emitting Diode (OLED) display element and a collimation mechanism, and the collimation mechanism is configured to collimate a light beam emitted by the micro OLED display element.

In another aspect, the present disclosure provides in some embodiments a display method for the above-mentioned display device, including: emitting, by the optical element, the at least two types of light beams having different image information, and transmitting, by the optical element, the at least two types of light beams toward the light-entering region of the optical waveguide layer; changing a transmission direction of each of the at least two types of light beams having entered the optical waveguide layer, to enable each of the at least two types of light beams in the optical waveguide layer to transmit in the direction toward the light-exiting region of the optical waveguide layer; and enabling the light beams formed by the light beams having same image information in the at least two types of light beams to exit from the light-exiting region and be converged at the same viewpoint, and enabling the light beams formed by the light beams having different image information in the at least two types of light beams to exit from the light-exiting region and be converged at the different viewpoints, to form the at least two predetermined viewpoints located within the visual range of the same pupil.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described in details hereinafter in conjunction with the drawings and embodiments.

In order to make the objects, the technical solutions and the advantages of the present disclosure more apparent, the present disclosure will be described in details hereinafter in conjunction with the drawings and embodiments. In the following description, specific details of configurations and assemblies are merely provided to facilitate the understanding of the present disclosure. It should be appreciated that, a person skilled in the art may make further modifications and alternations without departing from the scope and the spirit of the present disclosure. In addition, for clarification and conciseness, any known function and structure will not be described hereinafter.

It should be further appreciated that, such phrases as "one embodiment" and "one of the embodiments" intend to indicate that the related features, structures or characteristics are contained in at least an embodiment of the present disclosure, rather than necessarily referring to a same embodiment. In addition, the features, structures or characteristics may be combined in any embodiment or embodiments in an appropriate manner.

The features and principles of the present disclosure will be described hereinafter in conjunction with the drawings and embodiments. The following embodiments are merely for illustrative purposes, but shall not be construed as limiting the scope of the present disclosure.

Figure 1:
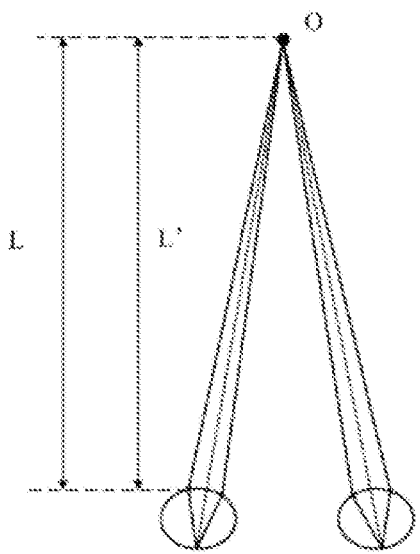
FIG. 1 is a schematic view showing an optical path when an image is viewed by human eyes in the real world.
Figure 2:
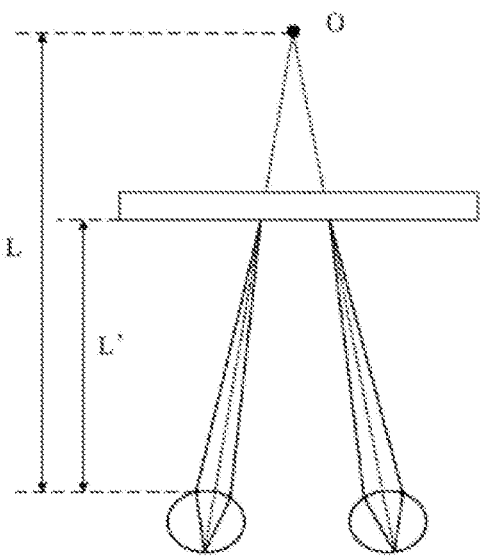
FIG. 2 is a schematic view showing an optical path when an image is viewed by human eyes through a parallax 3D technology in related art.

In real world, when an object O is viewed by human eyes at a distance from the object O, a focus position L of a single eye is consistent with a convergence distance L' of lines of sight for two eyes, i.e., on the object, as shown in FIG. 1. However, in a current parallax 3D technology, merely information about binocular parallax images viewed within an optical field, rather than optical field information such as a corresponding light direction desired for single-eye focusing, is provided by a screen, so the focus position of the single eye is always on the screen but the lines of sight for the two eyes are converged on the displayed virtual object at a certain distance from the screen due to the parallax. In other words, as shown in FIG. 2, the focus position L of the single eye is different from the convergence distance L' of the lines of sight for the two eyes, resulting in dizziness and discomfort of the viewer.

Usually, a binocular parallax 3D display technology is generally adopted by a current main-stream Augmented Reality (AR)/Virtual Reality (VR) display product. In order to relieve the dizziness and discomfort of the viewer caused by the conflict between single-eye focusing and double-eye convergence (i.e., the dizziness and discomfort of the viewer caused by the difference between the focus position L of the single eye and the convergence distance L' of the lines of sight for the two eyes), a focal plane for the single eye is placed at a fixed plane separated from the eye by about 5 m, and a double-eye convergence plane for the displayed 3D parallax image is placed at a position proximate to or beyond a position spaced apart from the human eye by 5 m. However, this will lead to a loss in contents for an image at a small distance as well as a decrease in the sense of immersion for the AR display. Alternatively, although the content for the image at a small distance is capable of being displayed, serious dizziness and discomfort may still exist.

In order to solve the above problem, the present disclosure provides in some embodiments a display device which, as shown in FIGS. 3 to 11, includes: an optical waveguide layer 1 having a light-entering region and a light-exiting region; an optical element 4 configured to emit at least two types of light beams having different image information, the optical element 4 being arranged at the light-entering region so as to transmit the at least two types of light beams to the light-entering region of the optical waveguide layer 1; a first coupling grating 2 arranged on a transmission path of the at least two types of light beams in the optical waveguide layer 1, and configured to change a direction of each of the at least two types of light beams having entered the optical waveguide layer 1, to enable each of the at least two types of light beams in the optical waveguide layer 1 to transmit in a direction toward the light-exiting region in e.g., a totally-reflected manner; and a second coupling grating 3 arranged in the optical waveguide layer 1 at a position corresponding to the light-exiting region, and configured to enable totally reflected light beams formed by light beams having same image information in the at least two types of light beams to exit from the light-exiting region and be converged at a same viewpoint, and enable totally reflected light beams formed by light beams having different image information in the at least two types of light beams to exit from the light-exiting region and be converged at different viewpoints, to form at least two predetermined viewpoints located within a visual range of a same pupil.

Here, a person skilled in the art understands that, the first coupling grating 2 may be arranged in the optical waveguide layer 1, or at an outer surface of the optical waveguide layer 1. To be specific, usually a Bragg grating made of a common holographic material may be arranged in the optical waveguide layer 1, or sometimes at a surface (e.g., an outer surface) of the optical waveguide layer 1. For example, a surface relief grating may be located at the outer surface of the optical waveguide layer 1.

In addition, when the light beams having the same image information in the at least two types of light beams are converged at the same viewpoint, it actually means that the light beams corresponding to different micro display images enter the human eyes simultaneously in slightly-different view angle directions with different viewpoints as centers.

Here, a person skilled in the art understands that, the first coupling grating 2 is further configured to enable the at least two types of light beams to be transmitted in the optical waveguide layer 1 in any other appropriate manner in the direction toward the light-exiting region, which will not be particularly defined herein.

In addition, a person skilled in the art understands that, the first coupling grating 2 and the second coupling grating 3 of the display device are merely provided hereinabove for illustrative purposes, and the display device may further include another coupling grating according to the practical need, which will not be particularly defined herein.

For example, a distance between the two predetermined viewpoints in a first direction may be smaller than or equal to a predetermined value, so that the at least two predetermined viewpoints may be located within the visual range of the same pupil. The first direction may be a direction substantially parallel to a line connecting centers of two pupils of human eyes.

During the implementation, through the first coupling grating 2, it is able to change the direction of each of the at least two types of light beams in the optical waveguide layer 1, thereby to enable the at least two types of light beams to be transmitted in the optical waveguide layer 1 in e.g., a total-reflection manner toward the light-exiting region. Through the second coupling grating 3, it is able for the totally-reflected light beams formed by light beams having the same image information in the at least two types of light beams to exit from the light-exiting region and be converged at the same viewpoint. The totally-reflected light beams formed by light beams having different image information may exit from the light-exiting region and be converged at different viewpoints, so as to provide the at least two predetermined viewpoints located within the visual range of the same pupil. The at least two predetermined viewpoints within the visual range of the same pupil may form a viewpoint group, and different viewpoint groups may be located within visual ranges of different pupils. In this regard, when at least two rendered images are displayed by a display module with respect to at least two predetermined viewpoints, at least two rendered images may be acquired at the at least two predetermined viewpoints in the viewpoint group within the visual range of one pupil, so it is able to acquire the rendered image having a 3D effect through one pupil. In addition, in the case that the at least two appropriate rendered image are displayed, a focal length of a single pupil when the rendered image is acquired at the viewpoint group within the visual range of the pupil may be substantially the same as a convergence distance of lines of sight for the two pupils when the rendered image having the 3D effect is acquired through the viewpoint group within the visual range of each pupil. As a result, it is able to prevent the occurrence of the dizziness when the parallax 3D technology is adopted, i.e., it is able for the optical field 3D display device to provide the focal length of the single eye substantially the same as the convergence distance of the lines of sight for the two eyes.

Upon the receipt of different light beams, the human eyes may focus automatically due to stimulation. In the embodiments of the present disclosure, the light beams may stimulate the human eyes in such a manner that the focusing position of the single eye is substantially the same as the focusing position of the double eyes, so it is able to prevent the occurrence of the dizziness caused in the parallax 3D technology.

It should be appreciated that, the different image information represented by the at least two types of light beams may be different two-dimensional (2D) images viewed by the human eye at different viewing angles. Here, a person skilled in the art understands that, the different 2D images viewed at different viewing angles may refer to two different 2D viewing field images. To be specific, the two 2D viewing field images entering the human eye at different viewing angles may be images in a same scenario with respect to two viewing angles when the same human eye is located at different viewpoints (the different viewpoints may be different positions of the human eye when the human eye, as a single point, moves slightly within a range not exceeding a size of the pupil).

In order to reduce the crosstalk and reduce the difficulty in controlling the direction of the light beam, in the embodiments of the present disclosure, the at least two types of light beams may be collimated light beams.

When there are a relatively large quantity of predetermined viewpoints within the visual range of the same pupil, the at least two predetermined viewpoints may be arranged in a line-shape, a matrix-shape, a linearly radial shape, or a helically cycloidal and radial shape. Usually, the at least two predetermined viewpoints may be located at a same plane in front of the pupil, or at different planes, or within the pupil, as long as they are located within the visual range of the same pupil.

When the at least two viewpoints are located within the pupil, a distance between any two predetermined viewpoints within the visual range of the same pupil may be smaller than or equal to a predetermined value, and the predetermined value may be a diameter of the pupil. In the case of different environmental brightness values, the diameters of the pupil may be different (the pupil may increase or decrease along with the environmental brightness value). Generally speaking, the diameter of the pupil is typically 2.5 mm in a bright state, and 5 mm in a dark state. Hence, the distance between any two of the at least two predetermined viewpoints within the visual range of the same pupil may be smaller than or equal to 2.5 mm, or smaller than or equal to 5 mm. It should be appreciated that, the above diameters are merely two typical values, and the distance between any two of the at least two predetermined viewpoints within the visual range of the same pupil may also be of any other value, which will not be particularly defined herein.

It should be appreciated that, the visual range of one pupil may be within a spherical surface with a center of the pupil as a center and a diameter of the pupil as a radius, i.e., a maximum distance between the viewpoint within the visual range of the pupil and the center of the pupil may be equal to the diameter of the pupil, and a minimum distance between the viewpoint within the visual range of the pupil and the center of the pupil may be zero.

In order to reduce the crosstalk and facilitate the light beams having the same image information to be converged at the same viewpoint, the at least two types of light beams having different image information may be converged at at least two different viewpoints. The at least two different light beams may be transmitted in different transmission modes to the light-entering region of the optical waveguide layer 1. There may exist various transmission modes.

For example, in the embodiments of the present disclosure, the at least two types of light beams having different image information may be coupled by the first coupling grating 2, and then transmitted in e.g., a total-reflection manner in the optical waveguide layer 1 to the second coupling grating 3, coupled by the second coupling grating 3, and then exit from the optical waveguide layer 1. The light beams having different image information may be converged at different viewpoints, and the light beams having the same image information may be converged at the same viewpoint, the at least two types of light beams may be transmitted in different transmission modes to the optical waveguide layer 1.

For example, the different transmission modes may include that the at least two types of light beams may enter the optical waveguide layer 1 at different incident angles, so as to enable the at least two totally-reflected light beams corresponding to the at least two types of light beams to reach the second coupling grating 3 in different directions, thereby to form the at least two predetermined viewpoints.

FIGS. 3-6 show optical paths emitted when two types of light beams having different image information are transmitted respectively to the light-entering region of the optical waveguide layer 1 at different incident angles, diffracted by the first coupling grating 2 and the second coupling grating 3, and be converged at two different predetermined viewpoints (optical field sampling points). The two different predetermined viewpoints may be located within the visual range of the same pupil.

As shown in FIGS. 3-6, a first light beam having first image information may be transmitted into the light-entering region of the optical waveguide layer 1 at a first incident angle $\theta_{AI}$, diffracted by the first coupling grating 2, exit at a first emergence angle $\theta_A$, transmitted in the optical waveguide layer 1 in a total-reflection manner, diffracted by the second coupling grating 3, exit from the light-exiting region of the optical waveguide layer 1, and converged at a first predetermined viewpoint. On another hand, a second light beam having second image information may be transmitted into the light-entering region of the optical waveguide layer 1 at a second incident angle $\theta_{BI}$, diffracted by the first grating, exit at a second emergence angle $\theta_B$, transmitted in the optical waveguide layer 1 in a total-reflection manner, diffracted by the second coupling grating 3, exit from the light-exiting region of the optical waveguide layer 1, and converged at a second predetermined viewpoint. The first predetermined viewpoint may be located at a position different from the second predetermined viewpoint, and the first and second predetermined viewpoints may be located within the visual range of the same pupil. Through the first predetermined viewpoint and the second predetermined viewpoint, it is able to acquire the rendered image having a 3D effect, i.e., it is able to acquire the rendered image having the 3D effect through a single eye. Through a Bragg selectivity characteristic of each of the first coupling grating 2 and the second coupling grating 3 with respect to a light beam angle, it is able to adjust the single-eye focal length, thereby to prevent the occurrence of dizziness and discomfort of the viewer due to the difference between the single-eye focal length and the convergence distance of the lines of sight for double eyes.

Figure 7:
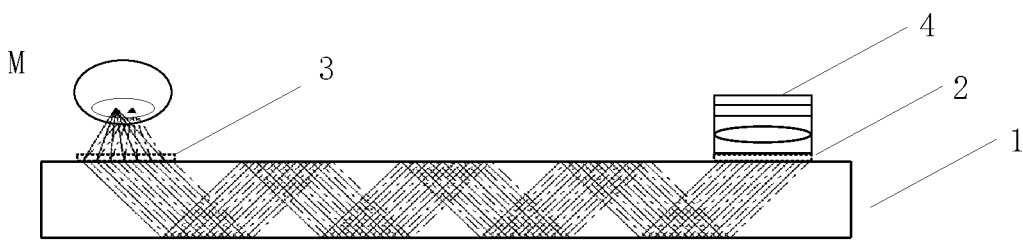
FIG. 7 is a fifth schematic view showing the display device according to an embodiment of the present disclosure.

For another example, the different transmission modes may further include that, the at least two types of light beams may enter the optical waveguide layer 1 at a same incident angle, and incident points where at least parts of first light beams in the at least two types of light beams enter the optical waveguide layer 1 may be staggered by a predetermined distance from incident points where at least parts of second light beams in the at least two types of light beams enter the optical waveguide layer 1, so as to enable incident points where at least two types of totally-reflected light beams formed by the at least two types of light beams enter the second coupling grating 3 in parallel to be staggered from each other in parallel, thereby to form the at least two predetermined viewpoints. As shown in FIGS. 7-10, the at least two types of light beams being parallel to each other and entering the first coupling grating 2 in a staggered manner may be coupled to form at least two types of totally-reflected light beams being parallel to each other and entering the second coupling grating 3 in a staggered manner. To be specific, as shown in FIG. 7, the light beams at the second coupling grating 3 may be changed into collimated light beams which enter the human eye at different angles. An angle between the two light beams may be set in such a manner that the two light beams do not overlap at the pupil but are both located within a range of the pupil.

In a possible embodiment of the present disclosure, the optical element may include at least two groups of pixel units arranged in a staggered manner and capable of emitting the at least two types of light beams having different image information. A plurality of subpixels in the at least two groups of pixel units may be arranged alternately and spaced apart from each other (e.g., pixels A11, B11, A12 and B12 may be arranged alternately and spaced apart from each other, and each subpixel may include three subpixel units R, G and B, or each subpixel may be monochromatic and emit light using R, G and B light sources sequentially). Correspondingly, the incident points of all the first light beams in the at least two types of light beams may be spaced apart respectively from and staggered in parallel by a predetermined distance from the incident points of all the second light beams in the at least two types of light beams entering the optical waveguide layer 1.

FIGS. 7-10 show the optical paths emitted when the two types of light beams having different image information and alternately staggered from each other in parallel are transmitted into the light-entering region of the optical waveguide layer 1 at a same incident angle and converged at two different predetermined viewpoints after being diffracted by the first coupling grating 2 and the second coupling grating 3, and the two different predetermined viewpoints may be located within the visual range of the same pupil.

As shown in FIGS. 7-10, the first light beam having the first image information may be transmitted into the light-entering region of the optical waveguide layer 1 at a first incident angle, diffracted by the first coupling grating 2, exit at a first emergent angle, transmitted in the optical waveguide layer 1 in a total-reflection manner, diffracted by the second coupling grating 3, exit from the light-exiting region of the optical waveguide layer 1, and converged at a first predetermined viewpoint. On another hand, the second light beam having the second image information may be transmitted into the light-entering region of the optical waveguide layer 1 at a second incident angle being substantially the same as the first incident angle, diffracted by the first grating, exit at a second emergent angle being substantially the same as the first emergent angle, transmitted in the optical waveguide layer 1 in a total-reflection manner, diffracted by the second coupling grating 3, exit from the light-exiting region of the optical waveguide layer 1, and converged at a second predetermined viewpoint. The first predetermined viewpoint may be located at a position different from the second predetermined viewpoint, and both the first and second predetermined viewpoints may be located within the visual range of the same pupil. Through reverse beam tracing, it is able to acquire an optical-field rendered image having a 3D effect in accordance with the first predetermined viewpoint and the second predetermined viewpoint, i.e., it is able to acquire the rendered image having the 3D effect through a single eye. The optical-field image may carry therein distance information about a display scenario, so it is able to stimulate the human eye to adjust the focal length, thereby to prevent the occurrence of the dizziness and discomfort of the viewer due to the difference between the single-eye focal length and the convergence distance of the lines of sight for the double eyes.

To be specific, the incident angles of the at least two types of light beams having different image information emitted by the optical element 4 into the optical waveguide layer 1 may be set in accordance with a shape of the optical waveguide layer 1. In the embodiments of the present disclosure, the incident angle of each of the at least two types of light beams relative to the optical waveguide layer 1 may be $-15°$ to $15°$. Further, in order to increase coupling efficiency of the first coupling grating 2 and reduce the occurrence of stray light beams, the incident angle of each of the at least two types of light beams relative to the optical waveguide layer 1 may not be zero, i.e., each of the at least two types of light beams may enter the optical waveguide layer 1 at a predetermined angle relative to the light-entering region of the optical waveguide layer 1.

In the embodiments of the present disclosure, the first coupling grating 2 may include at least two first regions corresponding to the at least two types of light beams respectively, and the quantity of the at least two first regions may be the same as the quantity of the at least two types of light beams.

Figure 12:
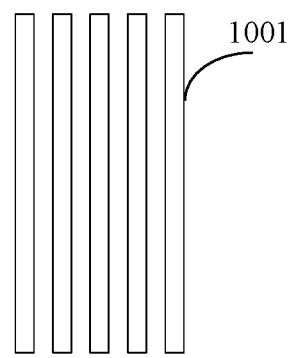
FIG. 12 is a schematic view showing a first coupling grating according to an embodiment of the present disclosure.
Figure 15:
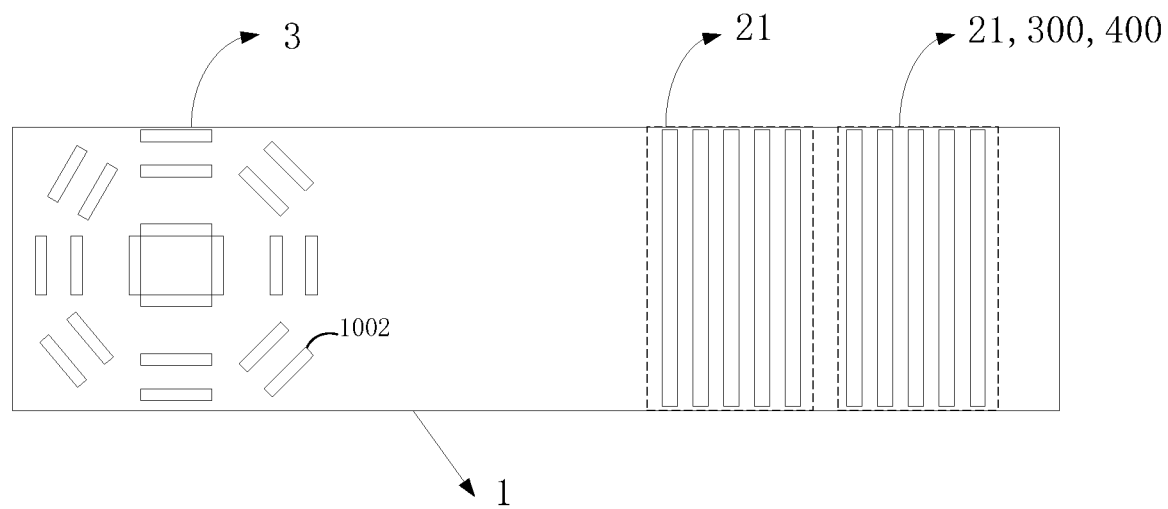
FIG. 15 is a schematic view showing the arrangement of the first coupling grating and the second coupling grating according to an embodiment of the present disclosure.
Figure 16:
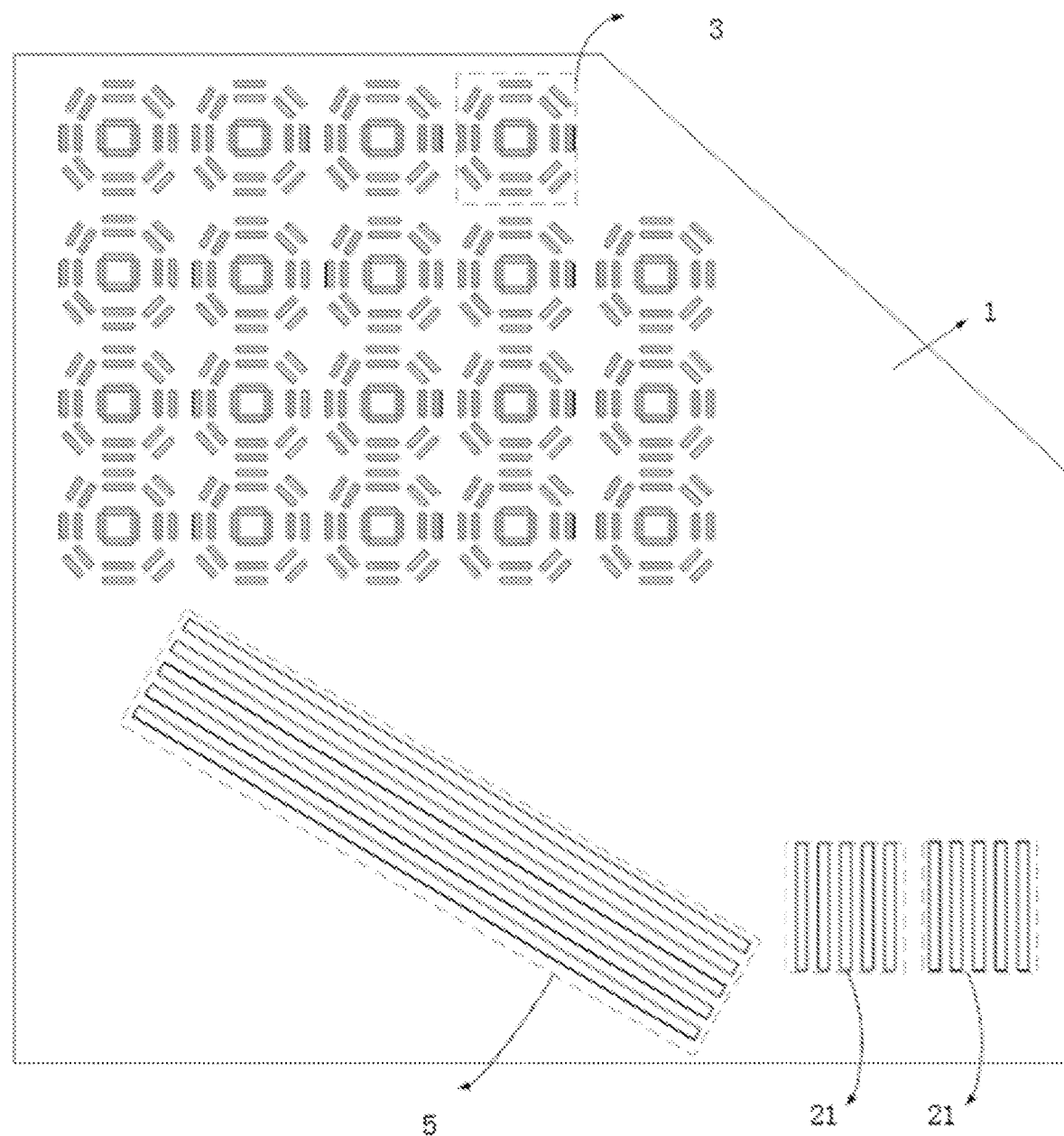
FIG. 16 is a schematic view showing the arrangement of the first coupling grating, the second coupling grating and the third coupling grating according to an embodiment of the present disclosure.

Each first region may include a plurality of first grating bars 1001 arranged substantially parallel to each other and spaced apart from each other on the optical waveguide layer, as shown in FIGS. 12, 15, and 16.

To be specific, as shown in FIG. 16, a line direction of gratings at the second coupling grating 3 may be substantially perpendicular to a line direction of the first region 21, and a grating period of the second coupling grating 3 may be between grating periods at the two first region 21 (as a better design), or the grating of the second coupling grating 3 may be equal to a certain grating period at the first region 21. The grating periods at the first region 21 may be different from each other, so as to provide the light beams at the second coupling grating 3 with such a coupling-out angle as to enable the light beams for different micro display images to enter the human eye simultaneously.

In addition, as shown in FIG. 16, a line direction of gratings at a third coupling grating 5 may be angled relative to a horizontal direction at about $45°$, and a grating period at the third coupling grating 5 may be $1/\sqrt{2}$ of the grating period at the second coupling grating 3.

As shown in FIG. 16, there may exist two first regions 21, and there may exist a plurality of second coupling gratings 3. This is because the second coupling gratings 3 may correspond to coupling-in micro projectors, every two micro projectors may not overlap each other, and an optical-field display effect may be achieved merely through at least two micro projectors. In other words, the second coupling grating 3 may correspond to an exit pupil. In order to enlarge a movable space for an eye box, it is necessary to extend the design of the exit pupil, i.e., a plurality of second coupling gratings 3 may be provided.

The first coupling grating 2 may include at least two first regions corresponding to the at least two types of light beams, so that each of light beams may be transmitted toward the first region corresponding to the light beam. When the incident points of the at least two types of light beams entering the optical waveguide layer 1 are different, the at least two first regions may be spaced apart from each other. The light beams may be coupled by the corresponding first regions of the first coupling grating 2, then coupled by the second coupling grating 3, and then converged at different predetermined viewpoints.

When the at least two first regions are completely separated from each other, i.e., when the at least two first regions are located at two separate regions on the optical waveguide layer, the at least two first regions may be formed on at least two grating structures respectively or on one grating structure according to the practical need.

When the at least two types of light beams enter the light-entering region of the optical waveguide layer 1 at different incident angles, the incident points of the at least two types of light beams transmitted to the first coupling grating 2 may overlap each other, i.e., the at least two types of light beams may be transmitted to a same region on the first coupling grating 2. In other words, the at least two first regions of the first coupling grating 2 corresponding to the at least two types of light beams may coincide with each other. The light beams may be coupled through the corresponding first region of the first coupling grating 2, then coupled by the second coupling grating 3, and then converged at different predetermined viewpoints. At this time, the first coupling grating 2 may be of a complex structure, and it is necessary to provide the first coupling grating 2 with a large angle response characteristic and a certain angle selection characteristic (to suppress the coupling-out of the stray signals).

In the embodiments of the present disclosure, the second coupling grating 3 may include at least two second regions corresponding to the at least two types of totally-reflected light beams formed after the coupling of the first coupling grating respectively.

Figure 13:
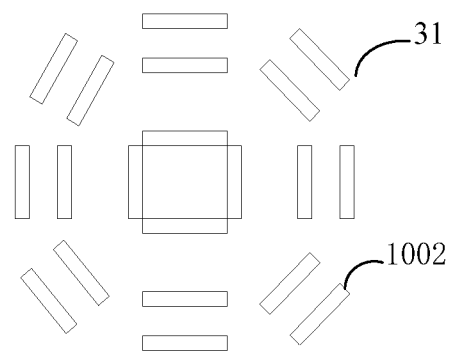
FIG. 13 is a schematic view showing a second coupling grating according to an embodiment of the present disclosure.

Each second region may include a plurality of ring-shaped gratings spaced apart from each other on the optical waveguide layer and sleeved one on another, and each ring-shaped grating may include a plurality of second grating bars 1002 arranged in a substantially circumferential direction along the ring-shaped grating and spaced apart from each other, as shown in FIG. 13.

In addition, when the at least two types of totally-reflected light beams formed after the at least two types of light beams have been coupled by the first coupling grating 2 reach the second coupling grating 3 at different positions (i.e., the grating bars at the at least two second regions 31 are staggered from each other or the at least two second regions 31 are completely separated from each other, and the at least two second regions do not overlap each other, as shown in FIG. 13). At this time, the second coupling grating 3 may have a simple structure and high reliability. However, the second coupling grating 3 needs to have a large area, or a space utilization rate of the light-exiting region of the optical waveguide layer 1 is not highly demanded, so it is adverse to the increase in the resolution of the display device.

When the at least two types of totally-reflected light beams formed after the at least two types of light beams have been coupled by the first coupling grating 2 reach the second coupling grating 3 at different positions, the structure of the second coupling grating 3 may be set in accordance with the incident points of the at least two types of totally-reflected light beams. For example, when incident points of at least parts of third light beams in the at least two types of totally-reflected light beams are staggered from incident points of at least parts of fourth light beams in the at least two types of totally-reflected light beams in the second coupling grating 3 (similar to an arrangement mode of pixels for a display device), grating bars at a region corresponding to the third light beams and grating bars at a region corresponding to the fourth light beams may be arranged in a staggered manner at positions corresponding to the incident points of the third light beams and the fourth light beams.

When the at least two types of totally-reflected light beams formed after the at least two types of light beams have been coupled by the first coupling grating 2 reach the second coupling grating 3 at a same position (i.e., the at least two second regions overlap each other), the second coupling grating 3 may be of a complex structure, and it is necessary to provide the second coupling grating 3 with a large angle response characteristic and a certain angle selection characteristic (to suppress the coupling-out of the stray light beams). In addition, it is also necessary for the light beams having different image information to be converged at different predetermined viewpoints (optical-field sampling points) after being diffracted and refracted by an interface between the optical waveguide layer and air. At this time, the second coupling grating 3 has a small area or the space utilization rate of the light-exiting region of the optical waveguide layer 1 is highly demanded, so it is able to improve the resolution of the display device.

In the embodiments of the present disclosure, the second coupling grating 3 may include a plurality of ring-shaped gratings spaced apart from each other on the optical waveguide layer 1 and sleeved one on another, and each ring-shaped grating may include a plurality of second grating bars 1002 arranged in a substantially circumferential direction along the ring-shaped grating and spaced apart from each other, as shown in FIGS. 13 and 15, so as to enable the light beams from the optical waveguide layer 1 to enter the human eyes, thereby to provide a large viewing field. FIG. 15 shows the arrangement of the first coupling grating and the second coupling grating in the optical waveguide layer (however the present disclosure shall not be limited thereto). To be specific, in FIG. 15, the first coupling grating 2 may include two first regions 21 independent of each other.

A principle of the second coupling grating 3 may be the same as that of the first coupling grating 2. The light beams in the optical waveguide layer 1 may be coupled by the grating coupling structure in a specific mode, so as to select an emergent direction and a color (i.e., wavelength) of the light beam. The coupling grating may include at least two regions corresponding to the at least two types of light beams respectively, so as to enable the at least two types of light beams to exit from the optical waveguide layer 1 and be converged at different predetermined viewpoints.

In the embodiments of the present disclosure, the first coupling grating 2 may be a reflection-type coupling grating or a transmission-type coupling grating, and the second coupling grating 3 may be a reflection-type coupling grating or a transmission-type coupling grating.

Figure 3:
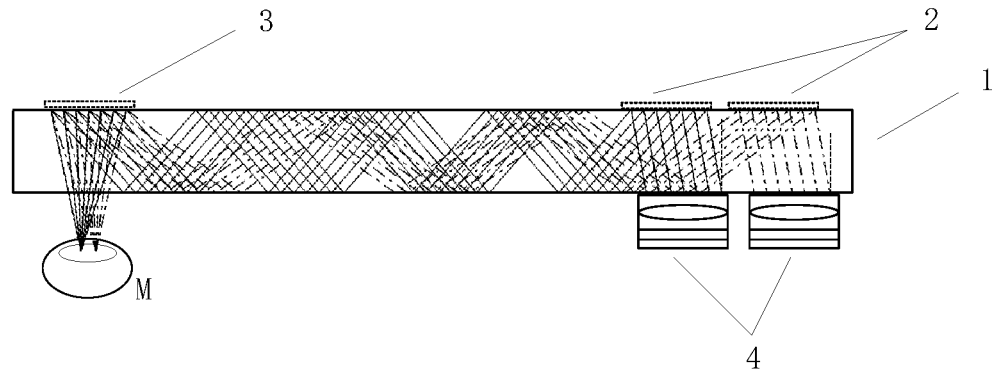
FIG. 3 is a first schematic view showing a display device according to an embodiment of the present disclosure.
Figure 4:
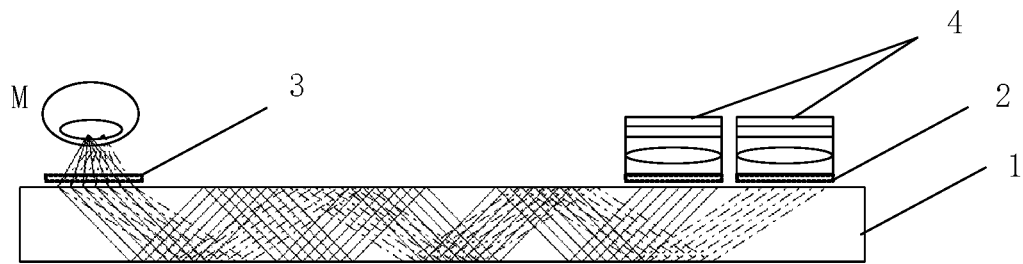
FIG. 4 is a second schematic view showing the display device according to an embodiment of the present disclosure.
Figure 5:
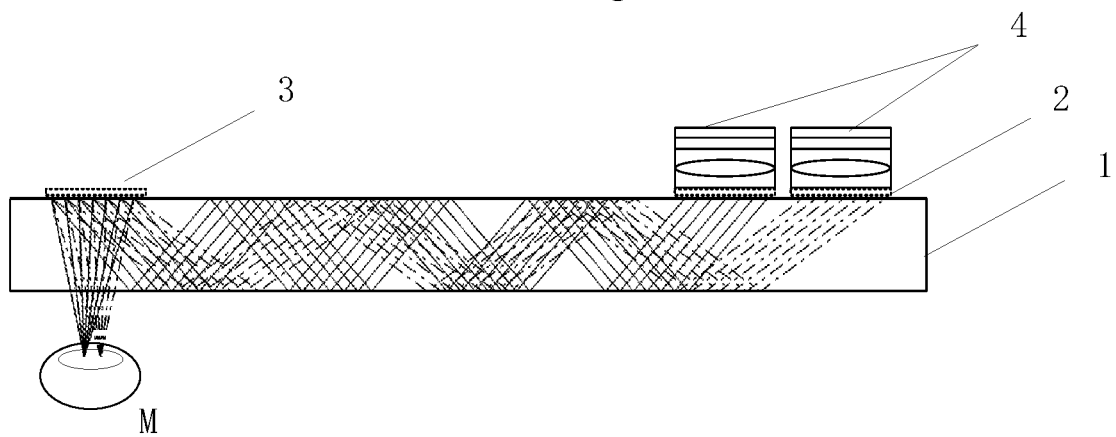
FIG. 5 is a third schematic view showing the display device according to an embodiment of the present disclosure.
Figure 6:
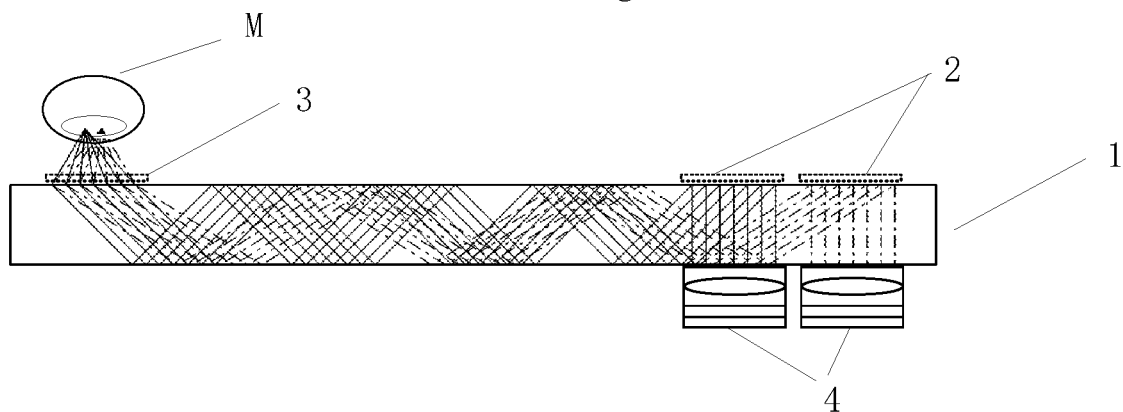
FIG. 6 is a fourth schematic view showing the display device according to an embodiment of the present disclosure.
Figure 8:
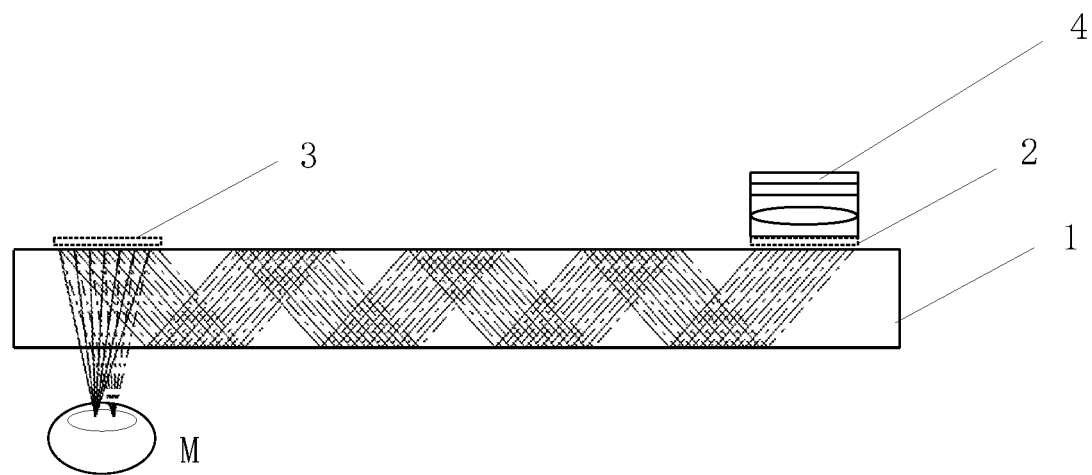
FIG. 8 is a sixth schematic view showing the display device according to an embodiment of the present disclosure.
Figure 9:
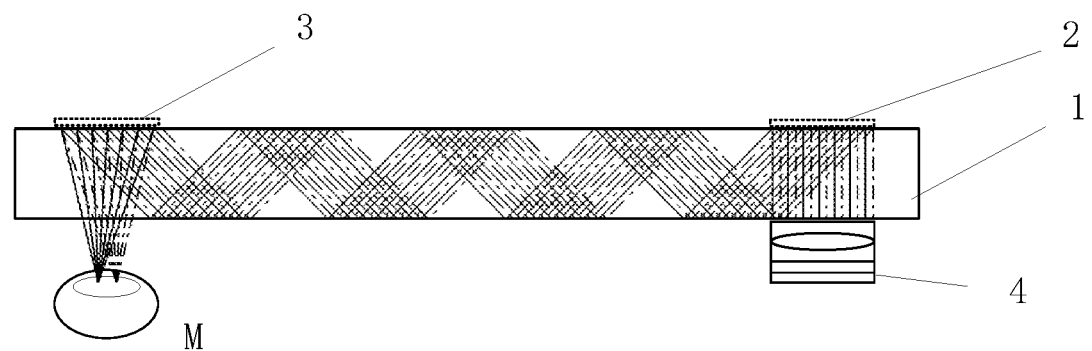
FIG. 9 is a seventh schematic view showing the display device according to an embodiment of the present disclosure.
Figure 10:
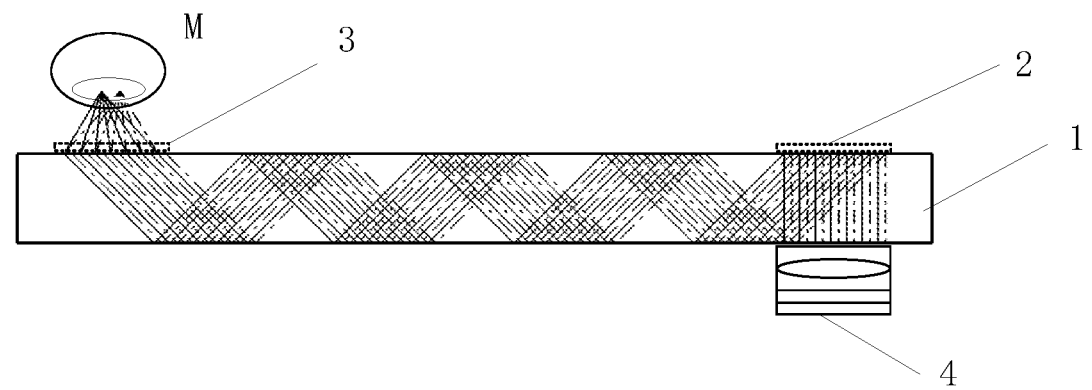
FIG. 10 is an eighth schematic view showing the display device according to an embodiment of the present disclosure.

To be specific, as shown in FIGS. 3 and 9, the first coupling grating 2 and the second coupling grating 3 may each be a reflection-type coupling grating. As shown in FIGS. 4 and 7, the first coupling grating 2 and the second coupling grating 3 may each be a transmission-type coupling grating. As shown in FIGS. 4 and 6, the first coupling grating 2 may be a reflection-type coupling grating and the second coupling grating 3 may be a transmission-type coupling grating. As shown in FIGS. 5 and 8, the first coupling grating 2 may be a transmission-type coupling grating, and the second coupling grating 3 may be a reflection-type coupling grating.

In the embodiments of the present disclosure, the third coupling grating 5 may be further arranged on the optical waveguide layer 1 and between the first coupling grating 2 and the second coupling grating 3, and configured to enlarge a field angle range of the totally reflected light beam transmitted in the optical waveguide layer.

Figure 14:
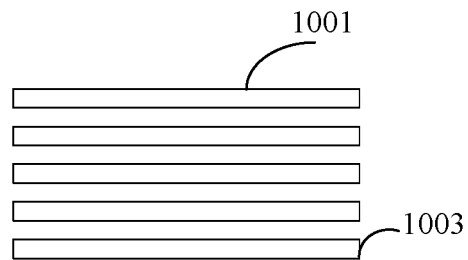
FIG. 14 is a schematic view showing a third coupling grating according to an embodiment of the present disclosure.

In the embodiments of the present disclosure, the first coupling grating 2 may include a plurality of first grating bars 1001 arranged substantially parallel to each other and spaced apart from each other on the optical waveguide layer 1, the third coupling grating 5 may include a plurality of third grating bars 1003 arranged substantially parallel to each other and spaced apart from each other on the optical waveguide layer 1, and an arrangement direction of each first grating bar 1001 of the first coupling grating 2 may be angled relative to an arrangement direction of each third grating bar 1003 of the third coupling grating 5 by a predetermined angle, as shown in FIGS. 14 and 16.

The first coupling grating 2 and the third coupling grating 5 may each include strip-like grating. For the first coupling grating 2 and the third coupling grating 5, the gratings may be arranged evenly at the entire region, or arranged at different portions arranged differently, so as to achieve equilibrium brightness for the entire image, and correct chromatic aberration and optical aberration. In a possible embodiment of the present disclosure, the grating bars of the first coupling grating 2 may be arranged orthogonal to the grating bars of the third coupling grating 5.

The at least two types of light beams may be transmitted into the light-entering region of the optical waveguide layer 1, exit from the first coupling grating 2 at angles of $\theta_A$ and $\theta_B$ respectively after being diffracted by the first coupling grating 2, transmitted in the optical waveguide layer 1 in a total-reflection manner to the third coupling grating 5, diffracted by the third coupling grating 5 to enlarge a viewing field angle range of the totally-reflected light beams transmitted in the optical waveguide layer 1 to distribute the light beams in a larger viewing field in the optical waveguide layer 1, diffracted by the second coupling grating 3, transmitted through the optical waveguide layer 1, and converged at at least two different predetermined viewpoints. As a result, it is able to enlarge a range of the viewing field.

In the embodiments of the present disclosure, the first coupling grating 2, the second coupling grating 3 and the third coupling grating 5 may each be a holographic grating which is made of e.g., a holographic polymer material and subjected to holographic exposure. Each of the coupling gratings may have a thickness of 0 to 5 mm.

The first coupling grating 2, the second coupling grating 3 and the third coupling grating 5 may each be a dielectric grating with reliefs on its surface, e.g., a common binary dielectric grating, a stepwise grating with an unequal thickness, or a stepwise grating with an equal thickness. Each of the coupling gratings may be formed through a process such as a laser direct writing process, a laser interference process, an electron beam lithography process, or a nanoimprint lithography process.

The first coupling grating 2, the second coupling grating 3 and the third coupling grating 5 may each be made of a gelling material acquired through a photolithographic or imprint process, or may each be formed through etching the optical waveguide layer 1 or a membrane on the optical waveguide layer 1 using the gelling material a mask.

The first coupling grating 2, the second coupling grating 3 and the third coupling grating 5 may each have a refractive index obviously different from that a medium in a gap between two adjacent grating bars ($\delta n > 0.3$). Each grating bar may have a thickness of 0-5 m or 0-1 μm.

It should be appreciated that, the angles mentioned hereinabove (including the incident angles of the light beams entering the light-entering region of the optical waveguide layer 1, and the emergent angles of the light beams exiting at the light-exiting region of the optical waveguide layer 1 after passing through the second coupling grating 3) may each refer to a transmission angle of the light beam in the optical waveguide layer 1. When the light beam enters the optical waveguide layer 1 from another medium (e.g., air), or exits the optical waveguide layer 1 and enters the other medium, the angle of the light beam may change depending on the refraction law (Snell law). Correspondingly, the optical path or convergence point may be corrected according to the practical need.

Figure 17:
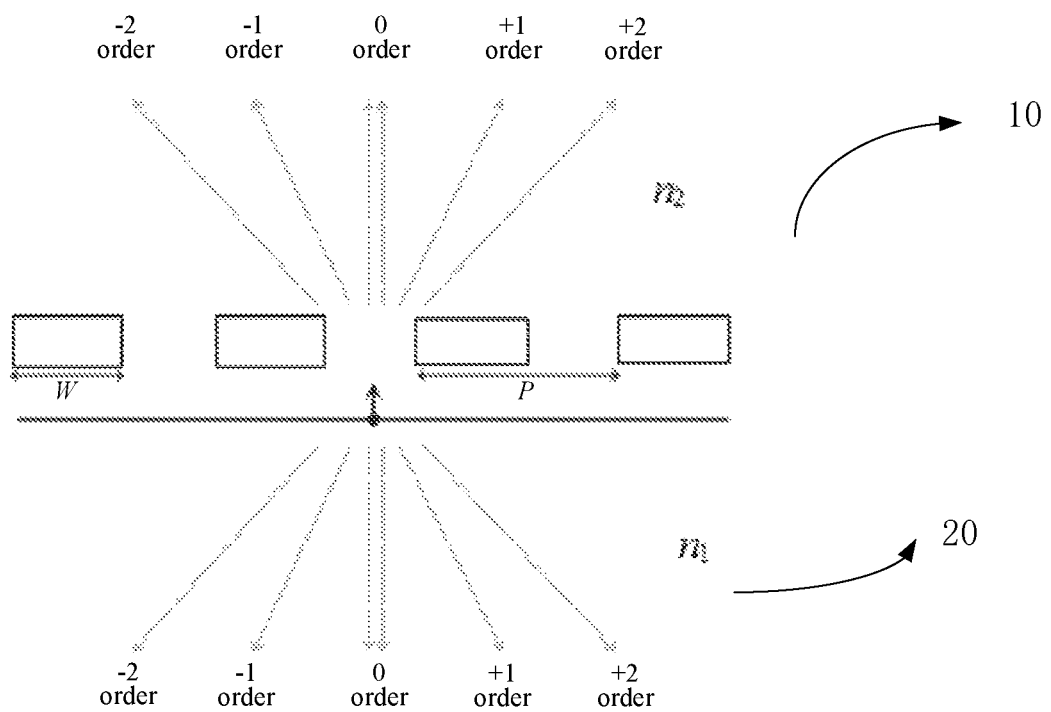
FIG. 17 is a schematic view showing diffraction waves of the coupling grating in various orders according to an embodiment of the present disclosure.

FIG. 17 shows the diffraction light paths for the coupling gratings (the first coupling grating 2, the second coupling grating 3 and the third coupling grating 5) in various orders.

A diffraction angle $\theta$ of an m-order diffraction wave of the grating may merely depend on a grating period P, a wavelength X of an incident wave, and an incident angle $\theta_0$. For a transmission-type wave 10, $n_2 \sin\theta - n_1 \sin\theta_0 = m\lambda/P$ ($m=0, \pm1, \pm2, \ldots$) (1); and for a reflection-type wave 20, $n_1 \sin\theta - n_1 \sin\theta_0 = m\lambda/P$ ($m=0, \pm1, \pm2, \ldots$) (2), where $n_1$ represents a refractive index of an incident medium, and $n_2$ represents a refractive index of a transmission medium.

In addition, for the selection of the positive and negative signs, when the transmission-type/reflection-type diffraction wave and the incident wave are located at different sides of a normal of an incident plane, a same sign may be selected for the angles corresponding to the transmission-type/reflection-type diffraction wave and the incident wave, and when otherwise, different signs may be selected. The selection of the positive and negative signs may depend on the selection of a coordinate system.

Usually, a 0-order and/or 1-order diffraction wave of the grating has a relatively large diffraction intensity, and a higher-order diffraction wave of the grating has a diffraction intensity far less than the 0-order or 1-order diffraction wave. A diffraction direction of the 0-order diffraction wave may be a refraction/reflection direction (Snell law), and a diffraction direction of a non-zero-order diffraction wave may be adjusted in accordance with the grating period.

In the embodiments of the present disclosure, the light beam may be deflected using a 1-order diffraction wave (transmission-type or reflection-type diffraction wave) of the grating, and the grating period may depend on the incident angle and the emergent angle of the light beam. However, the higher-order diffraction wave may also be used.

In order to improve brightness, brightness uniformity, color uniformity, white balance, and the like of the entire display image, it is necessary to finely adjust diffraction efficiency of the grating, which may be implemented through adjusting a depth (height) of the grating, a duty ratio, or morphology of a complex grating within an individual period (e.g., for a volume grating, it is necessary to adjust the distribution of the refractive indices in width, depth and height directions to acquire a desired optical modulation function, and for a stepwise grating, it is necessary to adjust the distribution of steps within an individual period).

Through the grating coupling structure, it is able to couple the light beams transmitted in the optical waveguide layer 1 in a specific mode, thereby to select an emergent direction and a color of the light beam. In the embodiments of the present disclosure, the at least two types of light beams may have different primary colors, e.g., red, blue and green. The optical waveguide layer 1 may include at least two optical waveguide sub-layers laminated one on another.

Each optical waveguide sub-layer may have a light-entering sub-region and a light-exiting sub-region. The first coupling grating 2 may be arranged in each optical waveguide sub-layer at a position corresponding to the light-entering sub-region, and the second coupling grating 3 may be arranged in each optical waveguide sub-layer at a position corresponding to the light-exiting sub-region. The first coupling grating 2 corresponding to a first optical waveguide sub-layer of the at least two optical waveguide sub-layers is configured to change a direction of a light beam having a first primary color, so as to transmit the light beam in the first optical waveguide sub-layer in a total-reflection manner toward the light-exiting sub-region. The first coupling grating 2 corresponding to a second optical waveguide sub-layer of the at least two optical waveguide sub-layers is configured to change a direction of a light beam having a second primary color different from the first primary color, so as to transmit the light beam in the second optical waveguide sub-layer in a total-reflection manner toward the light-exiting sub-region.

The quantity of the at least two optical waveguide sub-layers of the optical waveguide layer 1 may be equal to the quantity of the at least two types of light beams, i.e., one optical waveguide sub-layer may correspond to one light beam, and the first coupling grating 2 may be arranged on the corresponding optical waveguide sub-layer in accordance with the corresponding primary color of the light beam.

When the optical element 4 emits at least three light beams having different primary colors, the first coupling grating 2 may be arranged on each optical waveguide sub-layer. The first coupling grating on a third optical waveguide sub-layer of the at least two optical waveguide sub-layers may have at least two third regions 300 corresponding to the at least two types of light beams having different primary colors respectively, as shown in FIG. 15.

The first coupling grating 2 on a fourth optical waveguide sub-layer of the at least two optical waveguide sub-layers may have at least one fourth region 400, and a primary color of a light beam corresponding to the fourth region 400 may be different from that of a light beam corresponding to the third region 300, as shown in FIG. 15.

Figure 11:
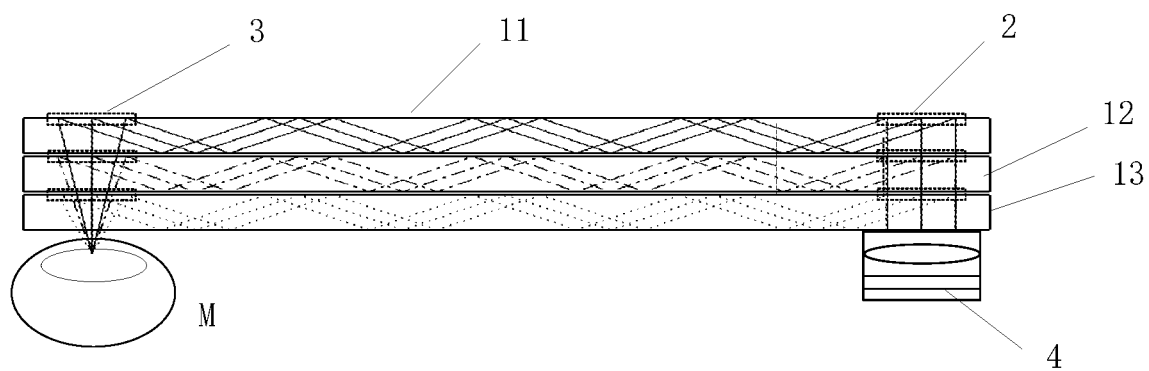
FIG. 11 is a ninth schematic view showing the display device according to an embodiment of the present disclosure.

There is small crosstalk between the red light beam and the blue light beam. In order to reduce the cost, the red light beam and the blue light beam may be transmitted within a same optical waveguide sub-layer. At this time, the first coupling grating 2 in the optical waveguide sub-layer (a first optical waveguide sub-layer 11) may include two second regions corresponding to the red light beam and the blue light beam respectively, as shown in FIG. 11. The green light beam may be transmitted within another optical waveguide sub-layer (a second waveguide sub-layer 12), and the first coupling grating 2 corresponding to the green light beam may be arranged in the other optical waveguide sub-layer. The first coupling grating in the second optical waveguide sub-layer 12 may be used to couple the green light beam merely, and the red light beam and the blue light beam may directly pass through the first coupling grating and enter the first optical waveguide sub-layer 11.

In a possible embodiment of the present disclosure, the optical waveguide layer 1 may be of a single-layer structure. When the at least two types of light beams have at least two different primary colors, the first coupling grating 2 may include at least two different regions each corresponding to the light beams having the same primary color. The structure of the first coupling grating 2 may be accurately designed in accordance with different trajectories of the light beams having different primary colors in the optical waveguide layer 1, so as to provide a color display effect through the single-layered optical waveguide layer 1.

In the embodiments of the present disclosure, the optical waveguide layer may be a light guide plate having a first side and a second side arranged opposite to each other, and the light-entering region and the light-exiting region may be arranged at different positions at a same side of the light guide plate.

Alternatively, the light-entering region may be located at the first side, the light-exiting region may be located at the second side, and an orthogonal projection of the light-entering region onto the second side may be located at a position different from the light-exiting region.

In the embodiments of the present disclosure, the optical waveguide layer 1 (the light guide plate) may be made of a transparent material such as glass or resin. The optical waveguide layer 1 may have, but not limited to, a refractive index of 1.5 to 2.0, e.g., 1.7 to 1.8.

In a possible embodiment of the present disclosure, the optical element 4 is configured to emit the at least two types of light beams having different image information. The optical element 4 may include at least two display elements being independent of each other and arranged at the light-entering region of the light guide plate, and different display elements may emit the light beams having different image information. For example, in the display device as shown in FIGS. 3-6, two display elements may be provided (the quantity of the display elements may be set according to the practical need), one of them may emit a first light beam having first image information, and the other may emit a second light beam having second image information.

In another possible embodiment of the present disclosure, the optical element 4 may also include one display element arranged at the light-entering region of the light guide plate. The display element may include at least two display sub-regions capable of emitting the light beams having different image information.

In the above scheme, as shown in FIGS. 7 to 10, the optical element 4 may include one display element, and the one display element may include two display sub-regions. One of the display sub-regions may emit the first light beam having the first image information, and the other may emit the second light beam having the second image information.

The first coupling grating 2 may be of various structures, as long as the direction of each of at least two types of light beams entering the light-entering region of the optical waveguide layer 1 may be changed to enable the at least two types of light beams to be transmitted in the optical waveguide layer 1 in a total-reflection manner. In the embodiments of the present disclosure, the first coupling grating 2 may include a plurality of first grating bars 1001 arranged substantially parallel to each other and spaced apart from each other on the optical waveguide layer 1, as shown in FIG. 12. However, the present disclosure will not be limited thereto.

When the at least two display sub-regions of one display element emit at least two types of light beams having different image information, at least parts of one type of light beams may be substantially parallel to and staggered from at least parts of the other type of light beams. For the at least two first regions of the first coupling grating 2 corresponding to the at least two types of light beams, at least parts of the grating bars at one of the first regions may be substantially parallel to and staggered from at least parts of the grating bars at the other one of the first regions. The arrangement of the grating bars of the first coupling grating is highly demanded, so as to enable the at least two first regions of the first coupling grating 2 to be accurately aligned with the at least two types of light beams respectively.

When the at least two display elements emit the at least two types of light beams having different image information, the at least two first regions of the first coupling grating 2 may correspond to the at least two types of light beams respectively.

It should be appreciated that, a distance between the display element and the optical waveguide layer 1 may be set according to the practical need. In order to further improve the alignment accuracy between the first coupling grating and the display element, the display element may be located adjacent to the optical waveguide layer 1. In the embodiments of the present disclosure, a light-exiting surface of the display element may be, but not limited to, in contact with a light-entering surface of the optical waveguide layer 1, as shown in FIGS. 3 to 10.

In the embodiments of the present disclosure, the display element may be a micro display element. In a possible embodiment of the present disclosure, the display element may be a collimation micro display element capable of emitting a collimated light beam.

In a possible embodiment of the present disclosure, the display element may be, but not limited to, an optical engine.

In a possible embodiment of the present disclosure, the display element may include a light source assembly and a display chip (e.g., a first display chip 600 in FIG. 20 and a second display chip 900 in FIG. 21), and the light source assembly may include at least three types of monochromatic laser chips for emitting different monochromatic light beams.

In a possible embodiment of the present disclosure, the light source assembly may include at least three types of monochromatic LED chips for emitting different monochromatic light beams and a collimation mechanism configured to collimate the monochromatic light beams emitted by the at least three types of monochromatic LED chips.

In a possible embodiment of the present disclosure, the light source assembly may include a white LED and a collimation mechanism configured to collimate a light beam from the white LED.

The display chip may include a digital optical processing chip and a timing control chip configured to sequentially input the at least three types of monochromatic light beams emitted by the light source assembly into the digital optical processing chip.

In the embodiments of the present disclosure, the collimation mechanism may include, but not limited to, a collimation lens group.

Figure 20:
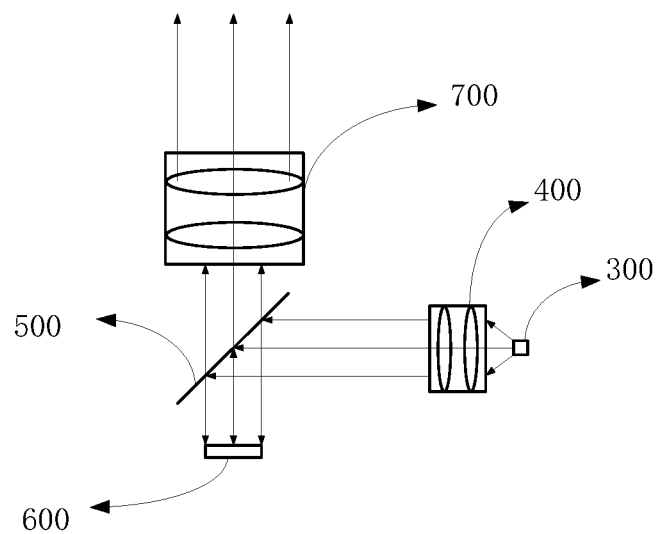
FIG. 20 is a second schematic view showing the micro display element according to an embodiment of the present disclosure.

To be specific, as shown in FIG. 20, the light source assembly may include a white LED 300, and the collimation mechanism may include a first collimation lens group 400 and a second collimation lens group 700. The display element may further include a polarization beam splitter (PBS) 500 arranged between the first collimation lens group 400 and the second collimation lens group 700. A light beam from the white LED 300 may be collimated by the first collimation lens group 400 into a collimated light beam. Part of the collimated light beam may be reflected by the PBS 500 toward the first display chip 600 (the first display chip 600 may be a reflection-type display element, so it is incapable of generating the light beam by itself). Part of the light beam from the first display chip 600 may pass through the PBS, then may be collimated by the second collimation lens group 700 into a collimated light beam, and then the collimated light beam may enter the light-entering region of the light guide plate 1.

Figure 21:
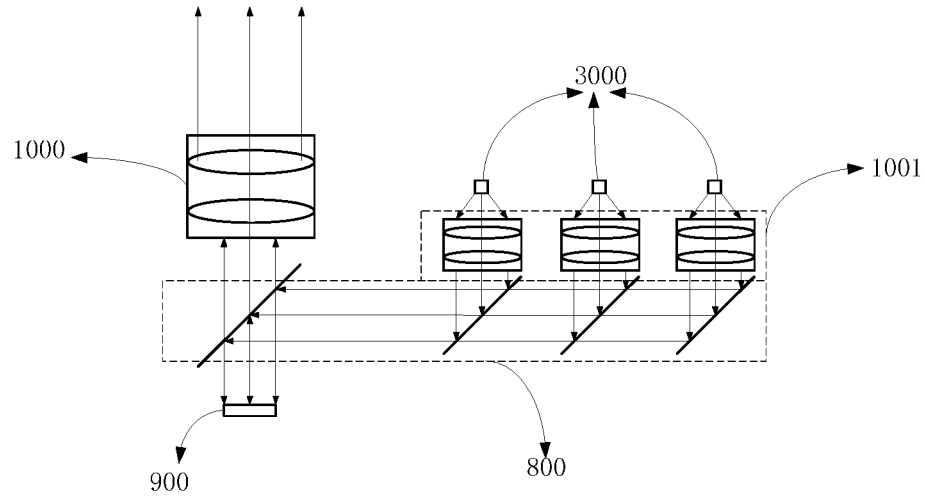
FIG. 21 is a third schematic view showing the micro display element according to an embodiment of the present disclosure.

As shown in FIG. 21, the light source assembly may include three types of monochromatic LED chips 3000 capable of emitting different monochromatic light beams, and the collimation mechanism may include a third collimation lens group 1001 and a fourth collimation lens group 1000. The third collimation lens group 1001 may include three collimation lens sub-groups corresponding to the three types of monochromatic LED chips 3000 capable of emitting different monochromatic light beams respectively. The display element may further include a PBS group 800 arranged between the third collimation lens group 1001 and the fourth collimation lens group 1000. The PBS group 800 may include first PBSs and second PBSs. The quantity of the first PBSs may be the same as the quantity of three types of monochromatic LED chips 3000 capable of emitting different monochromatic light beams. The second PBS is configured to reflect part of the light beams reflected by the three first PBSs for the second time toward the second display chip 900.

The light beams emitted by the three types of monochromatic LED chips 3000 capable of emitting different monochromatic light beams may be collimated by the third collimation lens group 1001 into a collimated light beam. The collimated light beam may pass through the PBS group 800 and reach the second display chip 900 (the second display chip 900 may be a reflection-type display element, so it is incapable of generating the light beam by itself). Part of the light beams from the second display chip 900 may pass through the second PBS, and then may be collimated by the fourth collimation lens group 1000 into a collimated light beam. Then, the collimated light beam may enter the light-entering region of the light guide plate 1.

Figure 19:
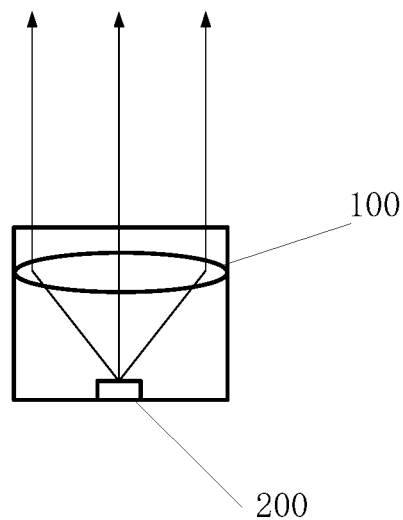
FIG. 19 is a first schematic view showing a micro display element according to an embodiment of the present disclosure.

In another possible embodiment of the present disclosure, the display element may include a micro OLED display element 200 and a collimation mechanism configured to collimate a light beam from the micro OLED display element, as shown in FIG. 19. In addition, the collimation mechanism in FIG. 19 may include, but not limited to, a fifth collimation lens group 100.

Figure 18:
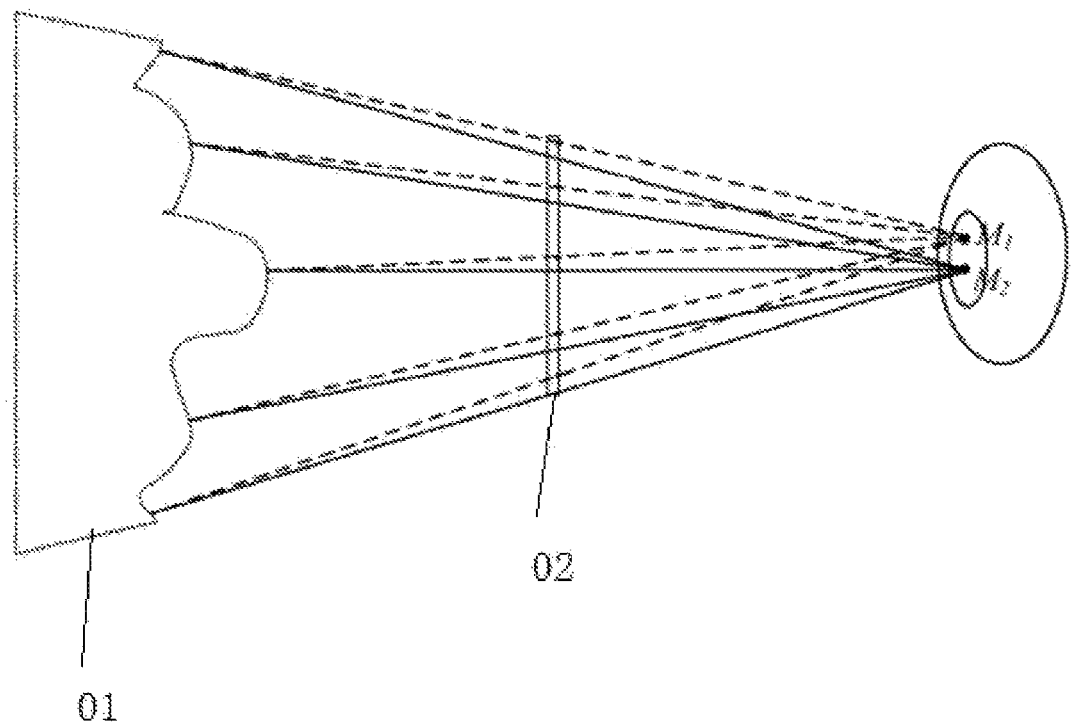
FIG. 18 is a schematic view showing an optical field and an optical path for a 3D image according to an embodiment of the present disclosure.

FIG. 18 shows an optical path of an optical field. A 3D scenario model includes a virtual 3D object 01, a virtual display screen 02, and at least two virtual viewpoints M1 and M2 on a same virtual pupil arranged sequentially (the optical path for acquiring an image having a 3D display effect through a single eye is merely shown in FIG. 18).

Through the optical waveguide layer 1, the first coupling grating 2 and the second coupling grating 3, the at least two types of light beams having different image information may be converged at at least two different predetermined viewpoints respectively, and the at least two different predetermined viewpoints may be located within the visual range of the same pupil. A corresponding optical-field image may be added to the pixels corresponding to each predetermined viewpoint, so as to emit the light beams having different image information (corresponding to the different images capable of being viewed at each viewpoint in a same display scenario). Hence, an optical field generated by a corresponding 3D depth-of-field scenario (the object 01) in the proximity of the pupil (within the pupil or at a position in front of the pupil by a predetermined distance) may be reproduced in a discrete manner at these predetermined viewpoints (optical-field sampling points), so these images may just form a common image on a retina through a human-eye optical system (the common image is just an image formed on the retina when a real scenario corresponding to a display scenario is viewed by the human eye in a real environment) when crystalline lenses in the human eye are in a certain convergence state (the convergence state is just a state where the real scenario corresponding to the display scenario is viewed by the human eye in the real environment), so as to achieve a 3D display effect through single-eye focusing. The convergence state of the crystalline lenses in the human eye may be changed, so as to selectively focus the object in the display scenario, thereby to selectively view the object in different depth-of-field scenarios at different distances and in different directions.

Usually, most of optical-field display prototypes have a relatively large volume (e.g., a prototype built on an optical platform at a model verification stage), or its design of an optical path is unsuitable for AR display (e.g., it is impossible to view an object in a perspective manner (such as Lanman, 2013, NVIDIA) or the display device has a very low transmittance, e.g., the design of a multi-layered Liquid Crystal Display (LCD) (such as Wetzstein, MIT)). In the embodiments of the present disclosure, it is able to achieve optical-field display through a holographic waveguide display technology. When the display device is applied to a head-mounted display device (especially for AR display), as compared with a conventional refractive optical element, it is able to remarkably improve the integration and portability of the elements, and thereby to provide a great commercial prospect.

The present disclosure further provides in some embodiments a display method for the above-mentioned display device, including: emitting, by the optical element, at least two types of light beams having different image information, and transmitting the at least two types of light beams toward a light-entering region of the optical waveguide layer 1 in different transmission modes; changing, by the first coupling grating 2, a direction of each of the at least two types of light beams in the optical waveguide layer 1, so as to enable the at least two types of light beams to be transmitted in a direction toward a light-exiting region of the optical waveguide layer 1 in e.g., a total-reflection mode; and enabling, by the second coupling grating 3, a light beam (e.g., a totally-reflected beam) formed by light beams having the same image information in the at least two types of light beams to exit from the light-exiting region and be converged at a same viewpoint, and enabling a light beam (e.g., a totally-reflected beam) formed by light beams having different image information in the at least two types of light beams to exit from the light-exiting region and be converged at different viewpoints, so as to form at least two predetermined viewpoints located within a visual range of a same pupil, to enable the same pupil to obtain at least two images.

According to the embodiments of the present disclosure, through the first coupling grating 2, it is able to change the direction of each of the at least two types of light beams in the optical waveguide layer 1, thereby to enable the at least two types of light beams to be transmitted in the optical waveguide layer 1 in a total-reflection manner toward the light-exiting region. Through the second coupling grating 3, it is able for the totally-reflected light beam formed by light beams having the same image information in the at least two types of light beams to exit from the light-exiting region and be converged at the same viewpoint. The light beam formed by the totally-reflected light beams having different image information may exit from the light-exiting region and be converged at different viewpoints, so as to provide the at least two predetermined viewpoints located within the visual range of the same pupil. The at least two predetermined viewpoints within the visual range of the same pupil may form a viewpoint group, and different viewpoint groups may be located within visual ranges of different pupils. In this regard, when at least two rendered images are displayed by a display module with respect to at least two predetermined viewpoints, at least two rendered images may be acquired at the at least two predetermined viewpoints in the viewpoint group within the visual range of one pupil, so it is able to acquire the rendered image having a 3D effect through one pupil. In addition, in the case that the at least two appropriate rendered image are displayed, a focal length of a single pupil when the rendered image is acquired at the viewpoint group within the visual range of the pupil may be substantially the same as a convergence distance of lines of sight for the two pupils when the rendered image having the 3D effect is acquired through the viewpoint group within the visual range of each pupil. As a result, it is able to prevent the occurrence of the dizziness when the parallax 3D technology is adopted, i.e., it is able for the optical field 3D display device to provide the focal length of the single eye substantially the same as the convergence distance of the lines of sight for the two eyes.

The display device in the embodiments of the present disclosure may be applied to glassless 3D display, i.e., at least two viewpoints may be formed on each of right and left eyes. The display device may also be applied to a glassed 3D display, i.e., a lens may be provided for each of the right and left eyes or a same lens may cover both the right and left eyes, so as to form at least two viewpoints on each of the right and left eyes.

Through the combination with the double-eye parallax 3D technology, it is able to adjust the focal length of the single eye into the convergence distance of the double eyes with respect to the same object, and ensure the focal length of the single eye to be consistent with the convergence distance of the double eyes, thereby to prevent the occurrence of the dizziness for the current parallax 3D technology. It should be appreciated that, usually the display method in the embodiments of the present disclosure is merely configured to adjust the focal length of the single eye for a virtual scenario within about 2 m. When the parallax 3D technology is applied to a virtual scenario beyond 2 m, generally no dizziness may occur, so it is unnecessary to adjust the focal length of the single eye.

The above embodiments are for illustrative purposes only, but the present disclosure is not limited thereto. It should be appreciated that a person skilled in the art may make further modifications and improvements without departing from the principle of the present disclosure, and these modifications and improvements shall also fall within the scope of the present disclosure.

What is claimed is:

1. A display device, comprising:
an optical waveguide layer having a light-entering region and a light-exiting region;
an optical element configured to emit at least two types of light beams having different image information, the optical element being arranged at the light-entering region, to transmit the at least two types of light beams to the light-entering region of the optical waveguide layer;
a first coupling grating arranged on a transmission path of the at least two types of light beams in the optical waveguide layer, and configured to change a direction of each of the at least two types of light beams having entered the optical waveguide layer, to enable each of the at least two types of light beams in the optical waveguide layer to transmit in a direction toward the light-exiting region; and
a second coupling grating arranged in the optical waveguide layer at a position corresponding to the light-exiting region, and configured to enable light beams formed by light beams having same image information in the at least two types of light beams to exit from the light-exiting region and be converged at a same viewpoint, and enable light beams formed by light beams having different image information in the at least two types of light beams to exit from the light-exiting region and be converged at different viewpoints, to form at least two predetermined viewpoints located within a visual range of a same pupil,
wherein the second coupling grating comprises at least two second regions, the at least two second regions correspond respectively to at least two types of light beams formed after the at least two types of light beams have been coupled by the first coupling grating; and
each of the at least two second regions comprises a plurality of ring-shaped gratings, the plurality of ring-shaped gratings are arranged on the optical waveguide layer and spaced apart from each other, and sleeved one on another, and each of the ring-shaped gratings comprises one or more second grating bars, the one or more second grating bars are arranged in a substantially circumferential direction along the ring-shaped grating and spaced apart from each other.

2. The display device according to claim 1, wherein the first coupling grating is further configured to change the direction of the at least two types of light beams having entered the optical waveguide layer, to transmit the at least two types of light beams in the optical waveguide in the direction toward the light-exiting region in a total-reflection manner, and
the second coupling grating is further configured to enable totally-reflected light beams formed by light beams having the same image information in the at least two types of light beams to exit from the light-exiting region and be converged at the same viewpoint, and enable totally-reflected light beams formed by light beams having different image information in the at least two types of light beams to exit from the light-exiting region and be converged at different viewpoints.

3. The display device according to claim 2, wherein the first coupling grating comprises at least two first regions corresponding respectively to the at least two types of light beams, and a quantity of the at least two first regions is same as a quantity of the at least two types of light beams; and
each first region comprises one or more first grating bars, and the one or more first grating bars are arranged substantially parallel to each other on the optical waveguide layer and spaced apart from each other.

4. The display device according to claim 2, further comprising:
a third coupling grating arranged between the first coupling grating and the second coupling grating, and the third coupling grating is configured to enlarge a field angle range of the light beam transmitted in the optical waveguide layer.

5. The display device according to claim 1, wherein
the first coupling grating comprises at least two first regions corresponding respectively to the at least two types of light beams, and a quantity of the at least two first regions is same as a quantity of the at least two types of light beams; and
each first region comprises one or more first grating bars, and the one or more first grating bars are arranged substantially parallel to each other on the optical waveguide layer and spaced apart from each other.

6. The display device according to claim 1, wherein
the first coupling grating is a reflection-type coupling grating or a transmission-type coupling grating, and the second coupling grating is a reflection-type coupling grating or a transmission-type coupling grating.

7. The display device according to claim 1, further comprising:
a third coupling grating arranged between the first coupling grating and the second coupling grating, and the third coupling grating is configured to enlarge a field angle range of the light beam transmitted in the optical waveguide layer.

8. The display device according to claim 7, wherein
the first coupling grating comprises one or more first grating bars, the one or more first grating bars are arranged substantially parallel to each other on the optical waveguide layer and spaced apart from each other, the third grating coupling comprises one or more third grating bars, the one or more third grating bars are arranged substantially parallel to each other on the optical waveguide layer and spaced apart from each other, and there is a predetermined angle between a direction in which the one or more first grating bars of the first coupling grating are arranged and a direction in which the one or more third grating bars of the third coupling grating are arranged.

9. The display device according to claim 1, wherein
the at least two types of light beams have different primary colors, and the optical waveguide layer comprises at least two optical waveguide sub-layers laminated one on another;
each of the at least two optical waveguide sub-layers has a light-entering sub-region and a light-exiting sub-region, the first coupling grating is arranged in each optical waveguide sub-layer at a position corresponding to the light-entering sub-region, and the second coupling grating is arranged in each optical waveguide sub-layer at a position corresponding to the light-exiting sub-region;
the first coupling grating corresponding to a first optical waveguide sub-layer of the at least two optical waveguide sub-layers is configured to change a direction of a light beam having a first primary color, to transmit the light beam in the first optical waveguide sub-layer toward the light-exiting sub-region; and
the first coupling grating corresponding to a second optical waveguide sub-layer of the at least two optical waveguide sub-layers is configured to change a direction of a light beam having a second primary color, to transmit the light beam in the second optical waveguide sub-layer toward the light-exiting sub-region.

10. The display device according to claim 9, wherein
the optical element is further configured to emit at least three types of light beams having different primary colors, and the first coupling grating is arranged on each of the at least two optical waveguide sub-layers;
the first coupling grating on a third optical waveguide sub-layer of the at least two optical waveguide sub-layers is provided with at least two third regions corresponding to the at least two types of light beams having different primary colors; and
the first coupling grating corresponding to a fourth optical waveguide sub-layer of the at least two optical waveguide sub-layers is provided with at least one fourth region, and a primary color of the light beam corresponding to the fourth region is different from a primary color of the light beam corresponding to the third region.

11. The display device according to claim 1, wherein
the optical waveguide layer is a light guide plate having a first side and a second side arranged opposite to each other, and the light-entering region and the light-exiting region are arranged at different positions at a same side of the light guide plate.

12. The display device according to claim 1, wherein
the optical waveguide layer is a light guide plate having a first side and a second side arranged opposite to each other, the light-entering region is arranged at the first side, the light-exiting region is arranged at the second side, and a region of an orthogonal projection of the light-entering region onto the second side is separated from the light-exiting region.

13. The display device according to claim 1, wherein
the optical element comprises at least two display elements arranged at the light-entering region of the light guide plate, and different display elements are configured to emit light beams having different image information.

14. The display device according to claim 13, wherein
the display element is a micro display device comprising a light source assembly and a display chip, and the light source assembly comprises at least three types of monochromatic laser chips configured to emit different monochromatic light beams.

15. The display device according to claim 14, wherein
the display chip comprises a digital optical processing chip and a timing control chip, and the timing control chip is configured to sequentially input the at least three types of monochromatic light beams emitted by the light source assembly into the digital optical processing chip.

16. The display device according to claim 13, wherein
the display element is a micro display device comprising a light source assembly and a display chip, and the light source assembly comprises at least three types of monochromatic Light-Emitting Diode (LED) chips and a collimation mechanism, the at least three types of monochromatic LED chips are configured to emit different monochromatic light beams, and the collimation mechanism is configured to collimate the monochromatic light beams emitted by the at least three types of monochromatic LED chips.

17. The display device according to claim 13, wherein
the display element is an optical engine.

18. The display device according to claim 13, wherein
the display element comprises a micro Organic Light-Emitting Diode (OLED) display element and a collimation mechanism, and the collimation mechanism is configured to collimate a light beam emitted by the micro OLED display element.

19. The display device according to claim 1, wherein
the optical element comprises one display element arranged at the light-entering region of the light guide plate, the one display element is provided with at least two display sub-regions, and different display sub-regions are configured to emit light beams having different image information.

20. A display method for the display device according to claim 1, comprising:
emitting, by the optical element, the at least two types of light beams having different image information, and transmitting, by the optical element, the at least two types of light beams toward the light-entering region of the optical waveguide layer;

changing a transmission direction of each of the at least two types of light beams having entered the optical waveguide layer, to enable each of the at least two types of light beams in the optical waveguide layer to be transmitted in the direction toward the light-exiting region of the optical waveguide layer; and enabling the light beams formed by the light beams having same image information in the at least two types of light beams to exit from the light-exiting region and be converged at the same viewpoint, and enabling the light beams formed by the light beams having different image information in the at least two types of light beams to exit from the light-exiting region and be converged at the different viewpoints, to form the at least two predetermined viewpoints located within the visual range of the same pupil.

\* \* \* \* \*